United States Patent [19]

Golecki

[11] Patent Number: 5,225,032
[45] Date of Patent: Jul. 6, 1993

[54] METHOD OF PRODUCING STOICHIOMETRIC, EPITAXIAL, MONOCRYSTALLINE FILMS OF SILICON CARBIDE AT TEMPERATURES BELOW 900 DEGREES CENTIGRADE

[75] Inventor: Ilan Golecki, Parsippany, N.J.

[73] Assignee: Allied-Signal Inc., Morris Township, Morris County, N.J.

[21] Appl. No.: 742,801

[22] Filed: Aug. 9, 1991

[51] Int. Cl.$^5$ .............................................. C30B 19/00
[52] U.S. Cl. ........................ 156/612; 148/DIG. 148; 156/610; 156/614; 156/DIG. 64; 156/DIG. 73; 156/DIG. 89; 437/100
[58] Field of Search ............. 148/DIG. 148; 156/610, 156/612, 614, DIG. 64, DIG. 73, DIG. 89; 437/100

[56] References Cited

U.S. PATENT DOCUMENTS

| | | | |
|---|---|---|---|
| 3,205,101 | 9/1965 | Mlavsky et al. | 437/100 |
| 3,510,369 | 5/1970 | Ernick et al. | 437/100 |
| 4,123,571 | 10/1978 | Balog et al. | 437/100 |
| 4,459,338 | 7/1989 | Angelini et al. | |
| 4,492,681 | 1/1985 | Endoh et al. | |
| 4,614,672 | 9/1986 | Addamiano | 437/100 |
| 4,676,966 | 6/1987 | Endoh et al. | |
| 4,923,716 | 5/1990 | Brown et al. | |

FOREIGN PATENT DOCUMENTS

| | | |
|---|---|---|
| 39708 | 3/1984 | Japan. |
| 139666 | 6/1986 | Japan. |
| 213252 | 9/1987 | Japan. |
| 185972 | 7/1990 | Japan. |

OTHER PUBLICATIONS

R. F. Davis, "The Physics and Chemistry of Carbides, Nitrides and Borides", R. Freer, ed. (Kluwer Academic Pub.:Dordrecht, The Netherlands) p. 589 (1990).
P. Liaw et al., "Epitaxial Growth and Characterization of B-SiC Thin Films", J. Electrochem. Soc., 132, p. 642 Mar. (1985).
Chaudhry et al., "Epitaxial Growth of B-SiC on Si by Low Temperature Chemical Vapor Deposition", J. Mater. Res., 5, p. 1595 Aug. (1990).
Furumura et al., "Heteroepitaxial B-SiC on Si", Proc. 10th Intl. Conf. on Chemical Vapor Deposition, Cullen & Blocher, Jr. eds. (The Electrochemical Soc., Inc.: Penington, N.J.), vol. 87-8, p. 435 (1987).
Eshita et al., "Low Temperature Heteroepitaxy of B-SiC on Si(111) Substrates" Mat. Res. Soc. Symp. Proc., 116, p. 357 (1988).
Sugii et al., "Low Temperature Growth of B-SiC on Si by Gas Source MBE", J. Electrochem. Soc., 137, p. 989 Mar. (1990).
Sugii et al., "SiC Growth and Its Application to Si-HBTs", paper #TC3-WeM4, 37th National Meeting of the American Vacuum Soc., Toronto, Canada (Oct. 10, 1990).
Yamada, J. Appl. Phys., 65, p. 2084 (1989) "Low Temperature 3C-SiC heteroepitaxial film growth on Si by reactive ion-beam deposition".
Nishino et al., "Epitaxial Growth of 3C-SiC on Si Substrate Using Methyltrichlorosilane", Proc. 1st. Intl. Conf. on Amorphous & Crystalline Silicon Carbide & Related Materials, Harris & Yang, eds. Dec. 10-11 (1987) pp. 78-83.
Delplancke, "Preparation and characterization of amorphous SiC:H thin films", J. Vac. Sci. Technol., A 9(3), May/Jun., (1991) pp. 450-455.

*Primary Examiner*—Robert Kunemund
*Assistant Examiner*—Felisa Garrett
*Attorney, Agent, or Firm*—Gerhard H. Fuchs; Richard C. Stewart

[57] ABSTRACT

Single crystalline, epitaxial, stoichiometric SiC films are deposited on single crystalline silicon substrates by a procedure which involves first treating the surface of the silicon substrate to remove any surface layer of SiO$_2$, followed by heating the substrate to temperature within the range of from about 600° to about 1000°0 C. and flowing a stream including a gaseous compound of Si, H and C—free of halogen and containing Si and C in 1:1 atomic ratio—over the heated substrate.

29 Claims, 1 Drawing Sheet

METHOD OF PRODUCING STOICHIOMETRIC, EPITAXIAL, MONOCRYSTALLINE FILMS OF SILICON CARBIDE AT TEMPERATURES BELOW 900 DEGREES CENTIGRADE

FIELD OF THE INVENTION

This invention relates generally to the field of growth of single-crystalline thin films by chemical vapor deposition, especially of silicon carbide (SiC), and to microelectronic materials utilizing such films.

BACKGROUND OF THE INVENTION

Silicon carbide (SiC) is the strongest near-term semiconducting candidate material for use in electronic and opto-electronic devices and circuits designed to operate at temperatures from 300° to 700° C. and above. The electronic and thermal transport properties of SiC, such as the carrier saturation velocity, the breakdown electric field and the thermal conductivity are significantly superior to those of Si and GaAs, making SiC very attractive for use in high power and high frequency applications. SiC is also more resistant to ionizing radiation than Si and GaAs. SiC exists in the cubic, $\beta$ phase as well as in about 170 hexagonal phases or polytypes. Each phase has a somewhat different energy band structure and thus a different bandgap and carrier mobilities. Bulk SiC, however, is not available in sizes above 1 inch and in high quality and purity, as required for practical applications. On the other hand, high quality and high purity Si is available in sizes up to 8 inches (200 mm) in diameter. Therefore, there have been intensive efforts to deposit SiC epitaxially, as a thin monocrystalline film, on a foreign single-crystalline substrate, primarily on Si. In this context, a single- or monocrystalline film has only one grain, with one orientation, while a polycrystalline film consists of a multitude of grains of differing orientations. Either detailed physical characterization (e.g. by transmission electron microscopy, TEM) or device data (e.g. carrier mobility) are needed to confirm single crystallinity. A film is considered to be epitaxial with the substrate if there are well-defined relationships between the orientations of the crystal planes in the film and those in the substrate, e.g. (100) SiC // (100) Si and [100]SiC // [100]Si. A preferentially oriented polycrystalline film can be epitaxial, but for high-performance electronic device applications, it is necessary to obtain a single-crystalline film.

Methods which have been used to deposit SiC films include chemical vapor deposition (CVD), evaporation in high vacuum, molecular beam epitaxy (MBE) in ultra-high vacuum (UHV), sputtering and laser ablation. Chemical vapor deposition has the unique advantage of producing conformal coatings, i.e. films which have near-constant thickness across the substrate, regardless of non-planar features on the substrate. Films deposited by CVD are conformal because in CVD, the gaseous precursor materials are thermally decomposed over, and only over the heated substrate; cooler areas in the deposition chamber will not, in principle, be deposited on. Thus, if the substrate is maintained at constant temperature, other conditions being equal, a uniform film will be obtained. Another very important advantage of CVD is the ability to dope the film in-situ n- or p-type, using appropriate precursor species. In the case of SiC, nitrogen, phosphorus or arsenic dopes the film n-type, and aluminum or boron (e.g. from diborane) dopes the film p-type. CVD can also be scaled up in size more readily than the other film deposition techniques and does not require UHV conditions.

Single-crystalline, epitaxial SiC films have been produced on Si by the CVD technique in the past and electronic devices have been fabricated in such films [see R. F. Davis, in "*The Physics and Chemistry of Carbides, Nitrides and Borides*", R. Freer, ed., Kluwer Academic Publishers: Dordrecht, the Netherlands, p. 589 (1990)]. However, most device-quality SiC films deposited on Si single crystals have been grown at relatively high temperatures of 1300°–1380° C. and at atmospheric pressure, using separate precursors for Si and C. For instance, $SiH_4$ or $Si_2H_6$ have been used for Si and $CH_4$ or $C_3H_8$ have been used for C [P. Liaw and R. F. Davis, J. Electrochem. Soc. 132, 642 (1985)]. The relatively high growth temperatures are detrimental to the quality of the films and the performance of the devices fabricated in them, due to the large mismatches in thermal expansion coefficients and lattice parameters of SiC and Si. For example, the thermal expansion coefficients of SiC and Si, averaged between 25° and 1000° C. are $4.45 \times 10^{-6}$ and $3.8 \times 10^{-6}$ per ° C., respectively. The lattice parameters of cubic $\beta$ SiC and Si at room temperature are 4.3596 and 5.431 Å, respectively. Due to these large mismatches in thermal expansion coefficients and lattice parameters of SiC and Si, SiC films grown on Si at such high temperatures are under high tensile stress and contain high concentrations of crystalline lattice defects. These defects degrade the performance of devices fabricated in such films. For instance, carrier mobilities are reduced and leakage currents are increased by the presence of electrically active defects. These defects originate at the SiC/Si interface and propagate through the growing layer. The defect concentration generally diminishes with increasing layer thickness, but the layers tend to crack if they are too thick. Thus, in order to fabricate electronic devices in the top $\approx 0.5$ $\mu m$ region of the film, a film up to 30 $\mu m$ thick must be grown. Since the growth rates for SiC on Si are generally below 2 $\mu m/h$, relatively long deposition runs are required, which are impractical and costly from a manufacturing standpoint. Ideally, films 0.2–2 $\mu m$ in thickness would be desirable. Deposition at such high temperatures is also more costly (a) in terms of the power required to heat the substrate, since the power required is proportional to $T^4$ (where T is in K) in this temperature region and (b) in terms of the materials used in constructing the deposition vessel, since quartz, for example, can only be used up to 1150° C. Furthermore, the lower the deposition temperature, the easier it is to maintain the purity of the deposition chamber and to minimize autodoping effects in the growing film, which are due to impurities from the growth environment. Finally, as the sizes of electronic circuits and devices shrink and their density increases, it becomes more important to reduce the processing temperatures used in fabrication, in order to preserve sharp junction interfaces and reduce diffusion and smearing of dopants and metal contacts. This is especially true when a SiC film is used as part of a device made in a lower bandgap and less refractory material, such as Si (e.g. SiC emitter in heterojunction bipolar transistor). Therefore, it is highly desirable to significantly reduce the temperature required for the deposition of SiC epitaxial layers. To summarize, the advantages of a lower deposition temperature are lower tensile stress in the films, lower defect concentrations, higher purity, improved device performance, reduced smearing of dopant profiles and junctions, faster growth time, lower power requirements, and lower equipment costs.

The use of separate precursors for Si and for C in the growth of SiC thin films is generally also undesirable, since it tends to result in small departures from stoichiometry, i.e. excess of Si or C, in the films. The stoichiometry of a SiC film produced from two separate gaseous precursors for Si and for C will depend primarily on the ratio of the two corresponding flow rates and also on the sticking coefficient of each entity on the surface of the substrate at the deposition temperature. Flow rates can only be controlled to a precision in the order of about 0.1% or 1000 ppm using state-of-the-art mass flow controllers, so that the ratio would have an uncertainty of at least about 0.2% or 2000 ppm. In addition, the Si precursor tends to decompose more readily than the C precursor at typical deposition temperatures of SiC. Thus, since the SiC material system cannot tolerate even small departures from stoichiometry (where Si/C=1), if excess Si or C atoms arrive at the surface, they result in Si or C interstitials, vacancies, anti-site defects or microscopic inclusions and precipitates, depending on the departure from stoichiometry. Since the dopant concentrations required to operate typical MOSFET or MESFET devices are in the range of $5 \times 10^{16}$–$5 \times 10^{18}$ atoms/cm$^3$, i.e. 1–100 ppm, the concentration of electrically active defects should be kept well below this range. In this respect, SiC differs from GaAs, where large excesses of arsenic are tolerated, as only the amount required to react with gallium is used, and the remainder does not stick to the surface. Thus, the growth of GaAs thin films can be accomplished well using two separate precursors for As and Ga, but in the case of SiC the use of two precursors is believed to degrade the quality of the film.

To date, most device-quality SiC films deposited on Si substrates have been produced by CVD processes which have suffered from one or more of these disadvantages: (1) high deposition temperature of 1300°–1380° C.; (2) use of separate precursors for Si and for C; and/or (3) need for a pre-deposition carbonization treatment step for the Si. Prior art attempts to produce device-quality epitaxial SiC thin films on Si at temperatures lower than 1300°–1380° C. used in CVD, or using a single source precursor for both Si and C, or under avoidance of a surface carbonization pretreatment step have generally not been successful.

Accordingly, it is an object of the present invention to provide a process for depositing a single crystal stoichiometric SiC film on a foreign substrate, in particular a Si substrate, at a temperature lower than heretofore thought practicable.

It is a further object of the invention to produce such SiC films from a single precursor containing silicon and carbon in a ratio of unity, which precursor is free of halogen atoms.

Lastly, it is an object of the invention to produce such SiC films at a temperature below 900° C., and specifically as low as 750° C. for cubic single-crystalline SiC.

SUMMARY OF THE INVENTION

These and other objects of the invention are accomplished by the provision of a process for depositing a single crystalline, epitaxial SiC film on a single crystal Si substrate, which process comprises, in combination, the steps of (a) treating the surface of the single crystalline silicon substrate to remove the surface layer of SiO$_2$ from said silicon substrate; followed by (b) heating said substrate to temperature in the range of from about 600° to about 1000° C. and flowing a gaseous stream comprising a compound composed of Si, H and C over said heated substrate, to thereby deposit a single crystalline epitaxial SiC film onto said substrate, wherein said compound contains Si and C in 1:1 atomic ratio.

Specifically, the compound composed of Si, H and C is (CH$_3$SiH)$_2$ or H$_3$SiCH$_3$. Both are known, commercially available compounds. Methylsilane, H$_3$SiCH$_3$, is preferred.

BRIEF DESCRIPTION OF THE DRAWINGS

With reference to the annexed drawings.

Figure 1:
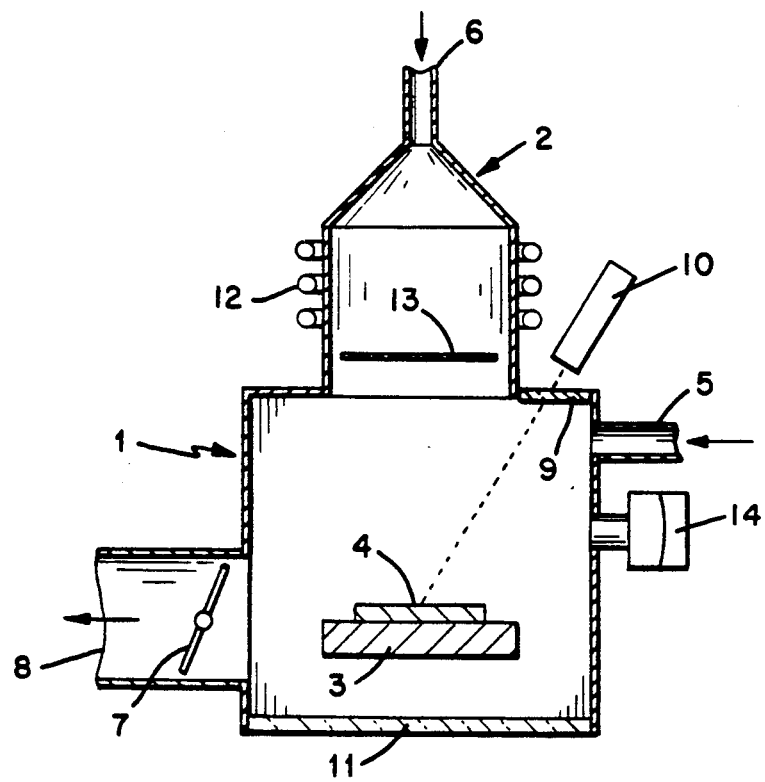
FIG. 1 is a schematic cross-sectional view of chemical vapor deposition vessel with associated auxiliaries suitable for the practice of the present invention.

DETAILED DESCRIPTION OF THE INVENTION OF THE PREFERRED EMBODIMENTS, AND OF THE BEST MODE PRESENTLY CONTEMPLATED FOR ITS PRACTICE

The deposition process involved in the invention method is known as chemical vapor deposition (CVD). Its general procedure and the design, construction and operation of the apparatus required for its practice are well known to those skilled in the art.

The first step in the invention method, viz. treatment of the surface of the single crystalline silicon substrate to remove the surface layer of SiO$_2$, can be accomplished by any suitable means, e.g. by chemical-mechanical abrasion, electropolishing, or chemical means, e.g. by subjecting the surface to the action of a reducing agent for SiO$_2$. The means employed are not critical, so long as the treatment exposes the silicon surface, without damage and essentially free from oxidation and contamination. A convenient method involves subjecting the substrate surface to the action of hydrogen at elevated temperature, say in the order of from about 600° to about 1000° C., for time sufficient to remove the SiO$_2$. This can be accomplished directly within the CVD chamber. Another exemplary method involves subjecting the surface to the action of aqueous hydrofluoric acid (HF), suitably at about room temperature or up to the boiling point of the aqueous HF.

The SiC vapor deposition step is conducted at temperature in the range of from about 600° to 1000° C. Temperatures above about 1000° C. are to be avoided, for two reasons: (1) with increasing temperature, there is danger that an exactly stoichiometric SiC film will not be deposited, resulting in contamination of the SiC film and imperfections in its crystal lattice, and (2) SiC films grown on Si at higher temperatures tend to be under high tensile stress and tend to contain high concentrations of crystalline lattice defects, all as described, supra, under Background of the Invention. Preferred operating temperatures are within the range of from about 700° to 1000° C., more preferably within the range of from about 750° to 1000° C.

The SiC may deposited on any desired crystal plane of the single crystalline silicon substrate, i.e. the (100), the (110) as well as the (111) plane.

The pressure under which the deposition process is conducted may vary widely. A suitable pressure range is from about $10^{-6}$ Torr to about 760 Torr. The partial pressure of the silane compound within the deposition chamber should generally not exceed 760 Torr, because at higher partial pressures there is danger of non-stoichiometric deposition of the SiC film.

The deposition process can be conducted in the absence or the presence of an applied plasma, generally a hydrogen plasma. If conducted in the absence of plasma, the SiC film will generally be obtained in single crystalline cubic form; if conducted in the presence of a plasma, it will generally be obtained in a single crystalline hexagonal form. The substrate may or may not be immersed within the plasma discharge region. Suitable plasma power is generally in the order of from about 40 to about 500 W, at frequency of from about 1 MHz to about 10 GHz.

The SiC film may be deposited by the invention method in any desired thickness, except that at thicknesses greater than about 50 $\mu$m on a Si substrate there is danger of cracking. Suitably, the film may be from about 5 to about $10^5$ Å thick. If desired, the resultant layered Si/SiC structure may be treated with a suitable solvent for the silicon, for example with an approximately 1:3 HF:HN0$_3$ mixture, to selectively remove the silicon substrate, or the silicon substrate may be removed mechanically, as by means of abrasion, and the resultant free-standing SiC wafer may be further subjected to the above-described deposition procedure to increase its thickness, or doped SiC layers may be deposited thereon, as to be described, infra.

One advantage of the invention process is that it permits ready deposition of doped SiC layers. The doping may be either of the n-type or of the p-type. Doping is readily accomplished by including into the deposition gas thermally decomposable, vaporizable compound containing the doping element. Suitable compounds for n-type doping include nitrogen, ammonia, phosphine or arsine, or a mixture of any of these compounds with hydrogen. Suitable compounds for p-type doping include diborane and tri-methyl aluminum, or a mixture of any of these compounds with hydrogen.

It is also possible to deposit alternating doped and undoped SiC layers; or to intersperse doped or undoped layers with doped or undoped single crystalline silicon layers, by depositing silicon onto the doped layer or layers, using any known procedure, conveniently by vapor deposition procedure.

Manipulative steps to be employed in the CVD procedure, and the choice of operating conditions (such as gas concentration, flow rates, etc.) other than those specifically discussed herein are within the skill of an ordinary, competent worker in the CVD field.

The invention is further illustrated by the exemplary procedure set forth below.

EXAMPLES

The apparatus employed and the operation procedures may be generally described as follows:

Suitable apparatus is illustrated by FIG. 1 of the drawings, which is a cross-sectional view of a chemical vapor deposition apparatus for depositing SiC film. The apparatus consists of a water-cooled, 12×12×12 inch stainless-steel deposition chamber 1 onto which is attached a 4 inch diameter quartz tube 2. The bottom flange of the chamber has an optional water-cooled, 7.5 inch diameter quartz window 11. The chamber can be pumped by means of a 400 l/s turbo-molecular pump backed by a 190 cfm Roots blower, in turn backed by a 48 cfm oil-free forepump, or alternately by the forepump and Roots blower without the turbo-molecular pump, or alternately by the forepump only; the pumps are denoted collectively by 8. Different base and working pressures can be reached, depending on which pumps are used. A throttle valve 7 allows control of the pressure in the chamber (pressure is measured with a diaphragm-type absolute manometer 14), by varying the flow conductance to the pumps. There are eight delivery lines of gaseous or liquid precursors, which can be connected to one of two manifolds: manifold 5, supplying a linear gas dispersion tube inside the deposition chamber 1, and manifold 6, supplying the quartz tube 2. Precursor line design is described in FIG. 2. The exhaust of the oil-free forepump is oxidized and thus rendered harmless in a furnace, or burn-box, which is supplied with flowing air and operated at 700°-1000° C. (e.g. -800° C). A copper coil 12, which is mounted around the quartz tube 2, is connected to a radio-frequency generator operating at 13.56 MHz. This arrangement permits an electrical plasma discharge to be operated in the quartz tube 2 under appropriate pressure and flow conditions, so as to generate a plasma consisting of excited molecules, atoms, radicals and ions. A metal grid 13, situated under the quartz tube 2, can be biased with respect to the grounded chamber 1 by means of an external dc power supply. This biasing, together with other operating conditions, permits controlling the extent of the electrical discharge; in particular the discharge may be confined to the quartz tube 2 above the grid 13, if desired. The substrate 4 may be mounted directly on a resistive heater 3, which is in turn mounted on a quartz ring, inside the deposition chamber 1. The heater is connected by wires via a high-vacuum feedthrough to an ac or dc power supply outside the deposition chamber. The quartz ring is secured in a water-cooled stainless-steel flange, connected to the side of the chamber 1. Other heaters, e.g. a bank of twelve quartz-halogen lamps, may be mounted underneath the chamber, against the water-cooled quartz window 11, to heat the substrate 4 in lieu of the heater 3. A pyrometer 10 may be used to measure the temperature of various elements inside the chamber 1, in particular the temperature of the substrate 4.

Figure 2:
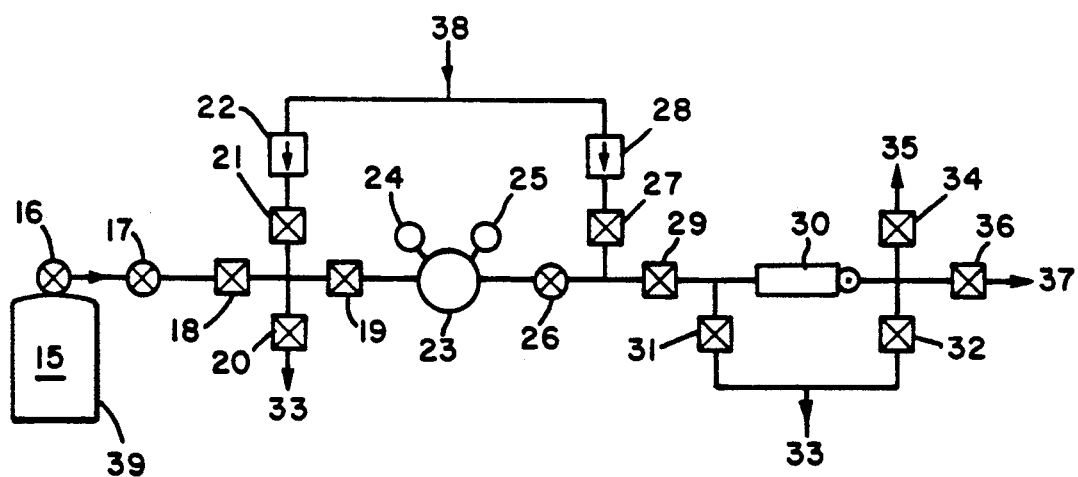
FIG. 2 is a schematic diagram of a gas delivery system for a chemical vapor deposition apparatus of the type generally represented by FIG. 1.

FIG. 2 is a diagram of one of the eight gas delivery lines and in particular of the delivery line used to introduce methylsilane into the deposition chamber of FIG. 1. A pressure vessel 39, typically a steel gas cylinder, contains the gaseous or liquid precursor 15. The precursor may be methylsilane, hydrogen, argon, nitrogen, diborane in hydrogen, nitrogen in hydrogen, propane, or other materials. A manual diaphragm valve 16 controls flow of the precursor from the vessel 15. An excess flow valve (EFV) 17 acts as a safety device to stop the flow if a pre-set limit in flow-rate is exceeded. A stainless steel mesh filter 18 stops dust and other particles greater than 2 $\mu$m. Air-operated bellows valve 19 permits the precursor to flow into the pressure regulator 23; the pressure can be read on the high and low pressure sides of the regulator by means of Bourdon-type pressure gauges 24 and 25, respectively. Each gauge has switching capabilities to alert the operator when pre-set pressures have been reached; gauge 24 indicates when the pressure is below a pre-set value, to aid in scheduling cylinder changes and gauge 25 indicates when the pressure is above a pre-set value, to indicate an unsafe regulator condition. The outputs from these gauges and the excess flow valve may be interlocked to valve 19 and other instruments, to shut the gas line or other devices off automatically in case of an unsafe condition. Manual valve 26 and air-operated valve 29 permit further flow of the precursor into the mass flow controller 30, which sets the flow rate as desired. Air-operated valves 36 and 34 connect to manifolds 5 and 6, respectively (FIG. 1). Air-operated valves 20, 31 and 32 allow evacuation of the corresponding portions of the delivery line by means of the Roots blower and oil-free forepump, via vacuum line 33. Air-operated valves 21 and 27 allow purging of the delivery line with high-purity argon (e.g. at 20 psig) from an argon manifold 38 via check-valves 22 and 28, respectively. The check-valves prevent back-flow from contaminating the argon manifold.

An exemplary deposition procedure follows:

Cleaning and degreasing of the substrate 4 prior to loading it in the deposition chamber 1. For a Si substrate, the degreasing may consist of soaking the substrate in (a) methylene chloride for 5 minutes while in an ultrasonic bath, (b) emptying the methylene chloride and rinsing with acetone, (c) soaking in acetone for 5 minutes while in an ultrasonic bath, (d) emptying the acetone and rinsing with isopropyl alcohol, (e) soaking in isopropyl alcohol for 5 minutes while in an ultrasonic bath, (f) emptying the isopropyl alcohol and rinsing with deionized water, (g) dipping in a 10% HF solution for 15 seconds and (h) blowing dry with dry nitrogen gas. Other solvents can be used (e.g. trichloroethane instead of methylene chloride, ethyl alcohol instead of isopropyl alcohol) and other soaking times can be used as well; the HF solution may have a concentration differing from 10%, e.g. 5% or 15%. The purpose of step (a) is to dissolve and remove organic contamination films which may have formed on the substrate surface in storage prior to use. The purpose of steps (b)–(f) inclusive is to sequentially remove traces of the solvents used. The purpose of step (g) is to remove the thin (typically 15–40 Å) amorphous $SiO_2$ layer which is always present on a Si wafer, so as to expose the single-crystalline Si surface and to passivate this surface with hydrogen. For other substrate materials, other organic solvents may be used and the HF dip may be omitted for $Al_2O_3$ (sapphire), for example.

Inserting the substrate in the deposition chamber 1 and mounting the substrate on a heater 3 or a pedestal. The heater may consist of a pyrolytic graphite resistor encapsulated in pyrolytic boron nitride. Alternately, the substrate may be mounted on a pedestal or ring made of quartz or other material, said pedestal or ring being mounted on the heater. Other means of heating the substrate mounted on a pedestal or ring may include illuminating it with lamps (e.g. tungsten-halogen lamps) or a laser situated under the deposition chamber, in lieu of the resistive heater. A water-cooled quartz window 11 permits the light from the lamps or the laser to reach the substrate and heat it by absorption.

Pumping down the deposition chamber 1. The deposition chamber 1 is hermetically sealed by closing suitable valves and flanges and pumped down to a base pressure in the range of $(1-10) \times 10^{-7}$ Torr, using the turbo-molecular, Roots and forepumps. It is useful to backfill the chamber with high-purity argon gas to atmospheric pressure prior to loading the substrate, so as to minimize introduction of oxygen and moisture from the ambient surroundings. It may also be useful to interrupt the pump-down procedure at a pressure in the range $(1-1000) \times 10^{-4}$ Torr, introduce high-purity argon to a pressure in the range 1–10 Torr and resume the pumping. It may be beneficial to repeat this evacuation and Ar purge cycle 2–3 times, in order to dilute and remove residues of oxygen and water vapor from the deposition chamber.

Pumping and purging the precursor delivery lines. Those precursor delivery lines which will be used for the particular deposition run are first evacuated and then purged with high-purity argon. One possible sequence, assuming all valves are initially closed, is as follows: (a) Open valve 32, open valve 29, open valve 26, set regulator output to 10 psig, open valve 19, reset EFV 17 if necessary, open valve 31, open valve 20. After each valve opening, a waiting period of the order of 10–1000 s may be required, to allow the pressure to decrease sufficiently. (b) Purging: Close valve 20, close valve 31, close valve 32, prepare argon manifold 38 with argon pressure in the 10–20 psig range, open valve 21. A waiting period of the order of 10–400 s may be required, to allow the pressure to equilibrate.

Heating and annealing the substrate 4 in flowing hydrogen. Hydrogen flow is established through the deposition chamber 1 via either manifold 6 or manifold 5, while the substrate is at room temperature. The flow rate may be in the range 1–5,000 sccm (for example, 360 sccm) and the pressure in the range $1 \times 10^{-6} - 760$ Torr (for example, 0.32 Torr). The heater is then energized to bring the substrate up to a pre-set temperature in the range 50°–200° C. (for example 100° C.), and after the substrate temperature has equilibrated, to a temperature in the range 600°–1000° C. (e.g. 900° C). The substrate is kept at temperature in flowing hydrogen for 10–60 min (for example, 30 min for a Si substrate). The coil 12 may but does not have to be energized during this procedure to a power in the range 40–500 W (e.g. 100 W), with the grid 13 biased negatively with respect to ground (e.g. to −60 V). When the coil is energized, a hydrogen discharge is created in the plasma tube and the total annealing time may be reduced (e.g. 10 min without discharge +10 min with a 100 W discharge). The purpose of this procedure is to cause desorption of any hydrogen left on the Si surface and removal of any thin $SiO_2$ left thereon, so as to expose the Si atoms in preparation for epitaxial growth of SiC. The exact values of the parameters may vary, depending on the prior cleaning/etching procedure used on the substrate, substrate material and orientation.

Deposition of a SiC thin film. The power to the heater is adjusted so as to bring the substrate to the desired deposition temperature, typically in the range 700°–900° C. Thereafter flow of methylsilane is first established through the valve 32 to the vacuum pumps. The flow rate is typically in the range 0.2–100 sccm (e.g. 1 sccm). After the flow is stabilized, valve 32 is closed and valve 36 is opened, thereby admitting methylsilane into the deposition chamber and starting the deposition of SiC on the substrate. Alternately, methylsilane may be admitted directly into the deposition chamber through valve 36. The deposition is continued until a film of the desired thickness is obtained. The deposition rate increases with increasing temperature and also with increasing plasma power and decreases with increasing hydrogen flow rate, other conditions being equal. Thus, the time required to obtain a film of a desired thickness will depend on all these parameters.

The following results were obtained in specific runs following the above-described general procedure:

In a first run, Run I, without any plasma, a 0.6 μm thick, single-crystalline, (100) oriented cubic SiC film was obtained on a (100) Si substrate at 825° C. in 150 min; flow conditions were 1 sccm methylsilane (partial pressure $1.2 \times 10^{-2}$ Torr) and 120 sccm hydrogen; total pressure was 0.36 Torr. The conditions in Run I for heating and annealing the substrate 4 in flowing hydrogen were 31 min at 900° C. in hydrogen flowing at 120 sccm and 0.36 Torr total pressure, without any plasma. The width of the (200) X-ray diffraction peak of the SiC film obtained in Run I was 1.6° of arc.

In a second run, Run II, a 0.22 μm thick, single-crystalline, (100) oriented cubic SiC film was obtained on a (100) Si substrate at 750° C. in 190 min; flow conditions were 0.2 sccm methylsilane (partial pressure $8 \times 10^{-4}$ Torr) and 360 sccm hydrogen for the first 80 min and 3.6 sccm methylsilane (partial pressure $1.1 \times 10^{-2}$ Torr) and 360 sccm hydrogen in the remaining 110 min, at a total pressure of 0.32 Torr, without any plasma. The conditions in Run II for heating and annealing the substrate 4 in flowing hydrogen were 30 min at 900° C. in hydrogen flowing at 360 sccm and 0.32 Torr total pressure, without any plasma. The width of the (200) X-ray diffraction peak of the SiC film obtained in Run II was 1.1° of arc, which indicated that the film in Run II had a better crystalline quality than the film in Run I. This would indicate that it is beneficial for obtaining SiC films of higher crystalline quality to start the deposition at a lower methylsilane flow, corresponding to a lower deposition rate, and to increase the methylsilane flow after the Si surface is substantially covered with SiC. The appearance of such single-crystalline SiC films is shiny and transparent, they have a high electrical resistivity (thus high purity) and show single-crystalline diffraction spots in selected area transmission electron diffraction patterns obtained in TEM. The X-ray diffraction measurements detect only the (200) peak of cubic SiC corresponding to the (100) plane and the corresponding peak from the Si substrate. No peaks from other planes of the film or substrate are seen. Infrared transmission measurements show the characteristic peak of SiC at about 790 cm$^{-1}$ and no other peaks are seen; in particular, no Si-H or Si-CH related peaks are seen. The SiC films do not contain measurable amounts of excess Si or C. There is no carbonization step in this process. UHV conditions (i.e. a background pressure lower than $1 \times 10^{-9}$ Torr) or a load-lock are not required. The dimensions of such SiC films are limited only by the dimensions of the available Si substrates (8 inches diameter at present) and the size of the deposition chamber and heater. Scale-up of the deposition chamber and heater can be accomplished readily without changing the fundamental steps or materials used in the process of this invention.

The above procedure will result in an undoped SiC thin film. If it is desired to deposit an n-type or p-type doped SiC thin film, or a sequence of layered SiC films, either undoped, or n-type or p-type doped, suitable precursors may be added in the step involving the deposition of the SiC thin film. For example, to obtain an n-type doped film, a mixture of nitrogen in hydrogen, ammonia in hydrogen, phosphine in hydrogen or arsine in hydrogen may be added. To obtain a p-type doped film, a mixture of diborane ($B_2H_6$) in hydrogen or trimethylaluminum may be added.

Furthermore, by adjusting the parameters of the apparatus, such as substrate temperature, flow rates, plasma power and pressure, SiC films having other structures than cubic can be deposited. For example, a SiC epitaxial film consisting predominantly of hexagonal 21R-SiC with some cubic SiC present can be obtained at 700° C., 6 sccm methylsilane partial pressure $2.5 \times 10^{-2}$ Torr), 240 sccm hydrogen, total pressure 0.28 Torr, plasma power 175 W, grid bias −60 V. A SiC epitaxial film consisting predominantly of cubic SiC with some hexagonal 21R-SiC can be deposited under the same conditions, except for a reduced flow of methylsilane of 2 sccm (partial pressure $8 \times 10^{-3}$ Torr). Thus, by adjusting the parameters of deposition, multilayered structures can be deposited, consisting of epitaxial SiC films of different structures and doping concentrations. The ability to deposit such structures at temperatures as low as 700°–900° C. and specifically 700°–750° C. has not been demonstrated before. It opens up the possibility of bandgap engineering, i.e. tailoring materials having a desired bandgap for particular applications, e.g. light emitters and light detectors in specific wavelength regions of the optical spectrum.

Since various changes may be made in the invention without departing from its spirit and essential characteristics, it is intended that all matter contained in the description shall be interpreted as illustrative only and not in a limiting sense, the scope of the invention being defined by the appended claims.

I claim:

1. The method for depositing a single crystalline, epitaxial SiC film on a single crystalline Si substrate which comprises, in combination, the steps of
   (a) treating the surface of the single crystalline silicon substrate to remove the surface layer of SiO$_2$ from said silicon substrate; followed by
   (b) heating said substrate to temperature in the range of from about 600° to about 1000° C. and flowing a gaseous stream comprising a compound composed of Si, H and C over said heated substrate, to thereby deposit a single crystalline epitaxial SiC film onto said substrate, wherein said compound contains Si and C in 1:1 atomic ratio.

2. The method of claim 1 wherein said compound composed of Si, H and C is selected from the group consisting of (CH$_3$SiH)$_2$ and H$_3$SiCH$_3$.

3. The method of claim 2 wherein said compound composed of Si, H and C is (CH$_3$SiH)$_2$.

4. The method of claim 2 wherein said compound composed of Si, H and C is H$_3$SiCH$_3$.

5. The method of claim 3 wherein the treatment of the surface of said single crystalline silicon substrate to remove the surface layer of SiO$_2$ involves the step of subjecting said surface to the action of a reducing agent for SiO$_2$.

6. The method of claim 4 wherein the treatment of the surface of said single crystalline silicon substrate to remove the surface layer of SiO$_2$ involves the step of subjecting said surface to the action of a reducing agent for SiO$_2$.

7. The method of claim 4 wherein the treatment of the surface of said single crystalline silicon substrate to remove the surface layer of SiO$_2$ involves the step of subjecting said surface to the action of hydrogen at elevated temperature.

8. The method of claim 7 wherein said surface is subjected to the action of hydrogen at temperature within the range of from 600° to about 1000° C.

9. The method of claim 6 wherein the treatment of the surface of said single crystalline silicon substrate to remove the surface layer of SiO$_2$ involves the step of subjecting said surface to the action of hydrogen fluoride.

10. The method of claim 9 wherein the hydrogen fluoride is an aqueous solution of hydrogen fluoride.

11. The method of claim 2 wherein said compound composed of Si, H and C is methylsilane, and wherein said substrate is heated to temperature within the range of from about 700° to about 900° C.

12. The method of claim 11 wherein the surface of the single crystalline silicon substrate is in the (111) crystal plane orientation.

13. The method of claim 11 wherein the surface of the single crystalline silicon substrate is in the (110) crystal plane orientation.

14. The method of claim 11 wherein the surface of the single crystalline silicon substrate is in the (100) crystal plane orientation.

15. The method of claim 11 wherein said substrate is heated in the absence of an applied plasma, and the SiC film is deposited in a cubic crystal structure.

16. The method of claim 11 wherein said gaseous stream comprises methylsilane and hydrogen, said substrate is heated in the presence of an applied hydrogen plasma, and the SiC film is deposited in a hexagonal crystal structure.

17. The method of claim 11 with the additional step of including a doping agent for the SiC in the gaseous stream comprising methysilane.

18. The method of claim 17 wherein the doping agent comprises a volatile and thermally decomposible compound of nitrogen, phosphorus or arsenic to obtain an n-type doped SiC film.

19. The method of claim 17 wherein the doping agent comprises a volatile and thermally decomposible compound of boron or aluminum to obtain a p-type doped SiC film.

20. The method of claim 2 with the additional step of treating the Si substrate bearing the single crystalline, epitaxially deposited SiC film to remove said substrate, and to recover the SiC film.

21. The method of claim 20 with the additional step of heating said recovered SiC film to temperature in the range of from about 600° to about 1000° C. and flowing a gaseous stream comprising a compound composed of Si, H and C which contains Si and C in 1:1 atomic ratio over said heated substrate, to thereby deposit additional single crystalline epitaxial SiC onto said SiC film.

22. The method of claim 2 wherein said single crystalline silicon substrate in step (a) is subjected to an atmosphere comprising hydrogen at a temperature in the range of from about 600° to about 1000° C., and wherein in step (b) said substrate is heated to temperature within the range of from about 750° to about 900° C. and is subjected to gaseous stream comprising hydrogen and methylsilane at a pressure of from about $10^{-6}$ Torr to about 760 Torr.

23. The method of claim 22 wherein said substrate is subjected to said gaseous stream at a pressure of from about $10^{-3}$ to about 760 Torr.

24. The method of claim 23 wherein the single crystalline epitaxial SiC is in a cubic crystal structure.

25. The method of claim 23 wherein the substrate is heated in the presence of an applied hydrogen plasma, and the single crystalline, epitaxial SiC is obtained in a hexagonal crystal structure.

26. The method of claim 23 wherein the SiC film has a thickness of from about 5° to about $10^5$Å.

27. The method of claim 23 sequentially conducted in the absence and presence of one or more doping agents, to obtain alternating doped and undoped layers of SiC on said single crystalline substrate.

28. The method of claim 23 conducted in the presence of an atmosphere comprising a doping agent for the SiC to obtain a doped SiC layer, with the additional step of epitaxially depositing a layer of single crystalline silicon onto said doped SiC layer.

29. The method of claim 28 sequentially repeated to obtain a structure comprising alternating layers, of doped or undoped SiC, and of doped or undoped silicon.

* * * * *